United States Patent
Kobayashi et al.

(10) Patent No.: US 8,891,697 B2
(45) Date of Patent: Nov. 18, 2014

(54) RECEPTION SIGNAL PROCESSING DEVICE

(75) Inventors: Masashi Kobayashi, Tokyo (JP);
Suguru Fujita, Tokyo (JP); Taiji Akizuki, Tokyo (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 13/816,076

(22) PCT Filed: Feb. 23, 2012

(86) PCT No.: PCT/JP2012/001256
§ 371 (c)(1),
(2), (4) Date: Feb. 8, 2013

(87) PCT Pub. No.: WO2012/120811
PCT Pub. Date: Sep. 13, 2012

(65) Prior Publication Data
US 2013/0136213 A1    May 30, 2013

(30) Foreign Application Priority Data
Mar. 10, 2011    (JP) .................................. 2011-053202

(51) Int. Cl.
| H04L 27/08 | (2006.01) |
| H03F 3/45 | (2006.01) |
| H03F 1/02 | (2006.01) |
| H04B 1/30 | (2006.01) |
| H03G 3/30 | (2006.01) |
| H03F 3/72 | (2006.01) |
| H03F 3/189 | (2006.01) |
| H04L 25/06 | (2006.01) |

(52) U.S. Cl.
CPC ............ *H04L 25/06* (2013.01); *H03F 3/45748* (2013.01); *H03F 1/0277* (2013.01);
(Continued)

(58) Field of Classification Search
CPC .......... H03D 3/008; H03D 2200/0047; H03D 2200/0025; H04L 27/3863; H04L 27/142; H03F 2200/372; H03F 1/0277; H03F 2200/336; H03F 3/45977; H03F 2200/294
USPC .................................................. 375/345, 346
See application file for complete search history.

(56) References Cited

U.S. PATENT DOCUMENTS

| 6,927,628 | B2 | 8/2005 | Oshima et al. |
| 7,257,385 | B2 | 8/2007 | Ono et al. |
| 7,265,611 | B2 | 9/2007 | Wang |
| 2003/0218501 | A1 | 11/2003 | Oshima et al. |
| 2005/0075088 | A1 | 4/2005 | Ono et al. |
| 2005/0107056 | A1 | 5/2005 | Okasaka et al. |
| 2006/0244520 | A1 | 11/2006 | Wang |
| 2007/0202813 | A1* | 8/2007 | Ono et al. ........................ 455/78 |

(Continued)

FOREIGN PATENT DOCUMENTS

| JP | 52-74734 A | 12/1975 |
| JP | 55-130411 A | 3/1978 |

(Continued)

OTHER PUBLICATIONS

International Search Report, mailed May 29, 2012, for International Application No. PCT/JP2012/001256, 2 pages.

*Primary Examiner* — Kabir A Timory
(74) *Attorney, Agent, or Firm* — Seed IP Law Group PLLC

(57) ABSTRACT

A reception signal processing devices includes a converter which converts an analog signal amplified by an amplifying section to a digital signal, switches respectively provided in post-stages of variable gain amplifiers of the amplifying section, a bypass switch section which sets to open and close a path in which outputs of the variable gain amplifiers go around the variable gain amplifiers of the post-stages and are inputted to the converter, a switch controller which controls the switches and the bypass switch section and a DC offset controller which sets a correction value of a DC offset in accordance with a gain set to the variable gain amplifier as an object to be corrected.

4 Claims, 12 Drawing Sheets

(52) U.S. Cl.
CPC .. *H03F 2203/7215* (2013.01); *H03F 2200/405* (2013.01); *H03F 2203/7236* (2013.01); *H04B 1/30* (2013.01); *H03F 2200/507* (2013.01); *H03F 2200/336* (2013.01); *H03G 3/3068* (2013.01); *H03F 2200/411* (2013.01); *H03F 2203/45702* (2013.01); *H03F 3/72* (2013.01); *H03F 2203/7227* (2013.01); *H03F 3/189* (2013.01); *H03F 3/45183* (2013.01); *H03F 2203/45212* (2013.01); *H03F 2203/45352* (2013.01); *H03F 2203/7231* (2013.01); *H03F 2203/7221* (2013.01); *H03F 2200/294* (2013.01)
USPC ........................................... 375/345; 375/346

(56) References Cited

U.S. PATENT DOCUMENTS

| | | |
|---|---|---|
| 2007/0202814 A1 | 8/2007 | Ono et al. |
| 2009/0264090 A1* | 10/2009 | Ivonnet et al. ............. 455/233.1 |
| 2011/0128992 A1* | 6/2011 | Maeda et al. ................. 375/130 |

FOREIGN PATENT DOCUMENTS

| | | |
|---|---|---|
| JP | 2003-152480 A | 5/2003 |
| JP | 2003-347873 A | 12/2003 |
| JP | 2005-110080 A | 4/2005 |
| JP | 2006-517765 A | 7/2006 |
| JP | 2009-239794 A | 10/2009 |

\* cited by examiner

FIG.2

| GAIN CONTROL BITS | DC OFFSET CORRECTION BITS |
|---|---|
| 0111100 | 000010 |
| 0111101 | 000011 |
| ... | ... |
| 1011101 | 111100 |
| 1011110 | 111110 |

RECEPTION SIGNAL PROCESSING DEVICE

TECHNICAL FIELD

The present invention relates to a reception signal processing device which down converts a high frequency reception signal to a base-band by using a direct conversion system.

BACKGROUND ART

As a digital device progresses to have high functions, since a capacity of contents handled by a user is increased, a high speed and large capacity communication is demanded. Further, as a CMOS process is developed to be very minute, a prospect is established that a transmission of Giga bit class using a milliwave may be realized. In this case, a high frequency IC which is compliant with a milliwave wireless communication is desirably inexpensive and has a low consumed power.

A down converting system using the high frequency IC has a Superheterodyne system and a direct conversion system. In the Superheterodyne system, a high frequency signal is temporarily down converted into an intermediate frequency, and after a down converting process, the signal is converted into a base band signal. On the other hand, in the down conversion system, the high frequency signal is not down converted into such intermediate frequency, but directly converted into a base band signal. Accordingly, the high frequency IC of the direct conversion system can have a circuit scale more reduced and is more suitable for a low cost and the low consumed power than that of the Superheterodyne system.

FIG. 11 is a diagram showing a structure of an orthogonal modulation receiving circuit including QPSK using the direct conversion system. In the receiving circuit, since a frequency of input signals to mixers 12 and 13 is equal to a frequency of a local oscillation signal (RF Local), a local leak arises that the local oscillation signal is transferred to pre-stages of the mixers 12 and 13.

As a result, a self mixing is generated in the mixers 12 and 13 to generate DC offsets. Signals including the DC offsets are amplified in variable gain amplifiers (VGA) 14 and 15 to vary DC offset components due to the self mixing. Accordingly, proper signals are hardly amplified in the VGAs 14 and 15, thereby to lead to a degradation of a communication quality.

Accordingly, the receiving circuit of the direct conversion system needs to use DC offset correcting circuits which correct the DC offsets in the VGAs 14 and 15 at the same time.

Patent Literature 1 discloses a technique that provides offset correcting circuits (OFC) respectively for variable gain amplifiers (PGA) to correct DC offsets in order from a first stage PGA to post-stage PGAs.

FIG. 12 is a block diagram showing a receiving circuit of a direct conversion system disclosed in Patent Literature 1. In the circuit shown in FIG. 12, in order to perform a correction of the DC offset under a non-input state, a power supply of an LNA is turned off. Then, in order to correct the DC offset to a PGA1, the DC offset is detected in an ADC1 in the offset correcting circuit 1 (OFC1).

A control circuit 240 determines a DC offset correction amount and applies a control voltage to the correcting circuit in the PGA1 through a DAC1 in the offset correcting circuit (the OFC1) to correct the DC offset.

CITATION LIST

Patent Literature

Patent Literature 1: JP-A-2005-110080

SUMMARY OF INVENTION

Technical Problem

However, in the receiving circuit shown in FIG. 12, the ADCs for detecting the DC offset are arranged respectively so as to correspond to the PGAs. Accordingly, the increase of the number of the PGAs leads to an increase of a circuit scale and an increase of a consumed power due to the increase of the ADCs. Especially, in the receiving circuit which is compliant with a high speed communication, since high speed ADCs are necessary, a problem concerning the circuit scale and the consumed power is more remarkable.

It is an object of the present invention to provide a reception signal processing device which is small in its circuit scale and low in its consumed power.

Solution to Problem

The present invention provides a reception signal processing device which down converts a reception signal of a high frequency to a base-band by using a direct conversion system, the reception signal processing device including: a mixer section which mixes the reception signal with a local oscillation signal of a predetermined frequency to perform a frequency conversion; an amplifying section including a plurality of variable gain amplifiers formed in multi-stages; a converter which converts an analog signal amplified by the amplifying section to a digital signal; isolation switches respectively provided in post-stages of the variable gain amplifiers included in the amplifying section; a bypass switch section which sets to open and close a path in which an output of the variable gain amplifier bypasses the variable gain amplifier of its post-stage and is inputted to the converter; a switch controller which controls the isolation switches and the bypass switch section so that the outputs of the variable gain amplifiers can be respectively inputted to the converter without passing through the variable gain amplifier of the post-stage; and a DC offset controller which sets a correction value for a DC offset in accordance with a gain set in the variable gain amplifier as an object to be corrected when the reception signal is not inputted to the variable gain amplifier as the object to be corrected and when an output of the variable gain amplifier of the object to be corrected is inputted to the converter without passing through the variable gain amplifier of the post-stage.

Advantageous Effects of Invention

According to the present invention, a reception signal processing device can be provided which is small in its circuit scale and low in its consumed power.

BRIEF DESCRIPTION OF DRAWINGS

FIG. 2 is a diagram showing one example of a table of correction values of DC offsets respectively for gains which are stored in a memory 117.

MODES FOR CARRYING OUT INVENTION

Figure 1:
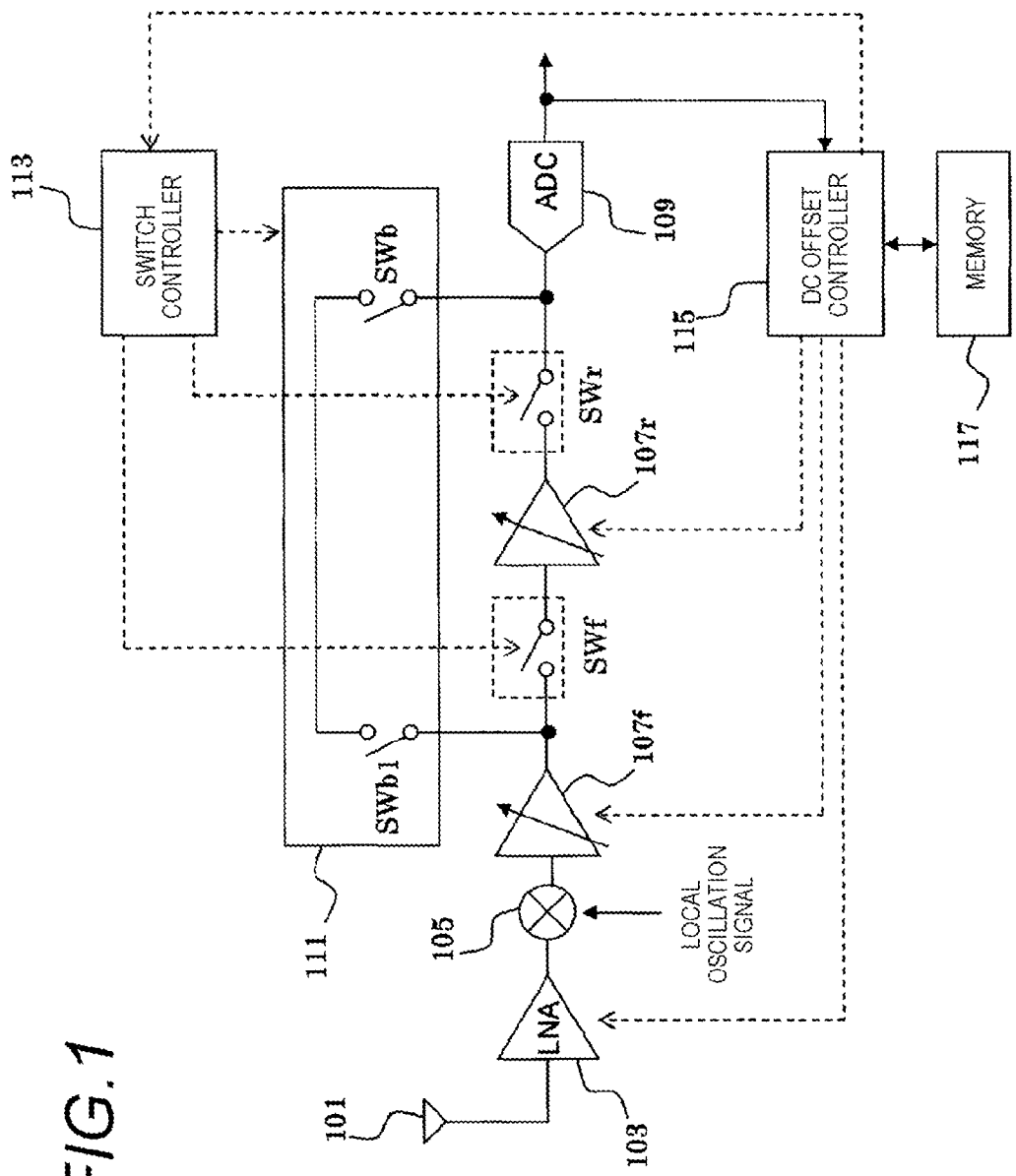
FIG. 1 is a block diagram showing a part of a structure of a reception signal processing device according to a first embodiment.

Now, embodiments of the present invention will be described below by referring to the drawings.

First Embodiment

FIG. 1 is a block diagram showing a part of a structure of a reception signal processing device according to a first embodiment. The reception signal processing device according to the present embodiment is applicable to a receiving circuit of a communication device including a portable telephone. The reception signal processing device shown in FIG. 1 is an orthogonal modulation receiving circuit including QPSK using a direct conversion system. In this case, a wiring after an LNA 103 in FIG. 1 includes an in-phase component and an orthogonal component.

The reception signal processing device shown in FIG. 1 includes an antenna 101, the LNA (Low Noise Amplifier) 103 as a differential amplification circuit for a high frequency, a mixer circuit 105, VGAs (Variable Gain Amplifier) 107$f$ and 107$r$ as high gain amplification circuits, an AD conversion circuit (ADC) 109, isolation switches SWf and SWr, a bypass switch section 111, a switch controller 113, a DC offset controller 115 and a memory 117.

The antenna 101 receives a radio signal. The LNA 103 amplifies the signal received by the antenna 101. A power supply of the LNA 103 is controlled to be turned on and off by the DC offset controller 115. Further, a structure may be used in which an isolation switch is added between the LNA 103 and the mixer circuit 105. The mixer circuit 105 combines a reception signal amplified by the LNA 103 with a local oscillation signal of a predetermined frequency to perform a frequency conversion. The VGAs 107$f$ and 107$r$ are formed in multi-stages between the mixer circuit 105 and the ADC 109. The ADC 109 converts an analog signal into a digital signal.

The isolation switches SWf and SWr are respectively provided in output sides of the VGAs. When the isolation switches SWf and SWr are turned off, the VGAs provided in pre-stages of the isolation switches which are turned off are electrically disconnected from component elements of post-stages. The bypass switch section 111 includes switches SWb1 and SWb set to open and close a path in which an output of the VGA 107$f$ of a first stage bypasses the VGA 107$r$ of a post-stage and is inputted to the ADC 109.

The switch controller 113 controls turning on and off states of the isolation switches SWf and SWr and the switches SWb1 and SWb of the bypass switch section 111 in accordance with a control signal from the DC offset controller 115 so that the outputs of the VGAs may be respectively inputted to the ADC 109 without passing through the VGAs of the post-stages. The DC offset controller 115 controls a DC offset component corresponding to a gain of each VGA for each of the VGAs. The DC offset controller 115 also controls the gains of the VGAs 107$f$ and 107$r$ respectively to allow amplitude to meet a full-scale of the ADC 109. Further, the DC offset controller 115 sets correction values for DC offsets in which DC components of the VGAs become desired values or smaller respectively for the gains of the VGAs. Further, to meet control timings of the gains of the VGAs 107$f$ and 107$r$ respectively, the DC offset controller 115 outputs control timing signals of the LNA 103, the isolation switches SWf and SWr and the switches SWb1 and SWb of the bypass switch section 111 to the switch controller 113.

The memory 117 stores a table of the correction values for the DC offsets respectively for the gains which are set by the DC offset controller 115 respectively for the VGAs. FIG. 2 is a diagram showing one example of the table of the correction values for the DC offsets respectively for the gains which are stored in the memory 117.

Figure 3:
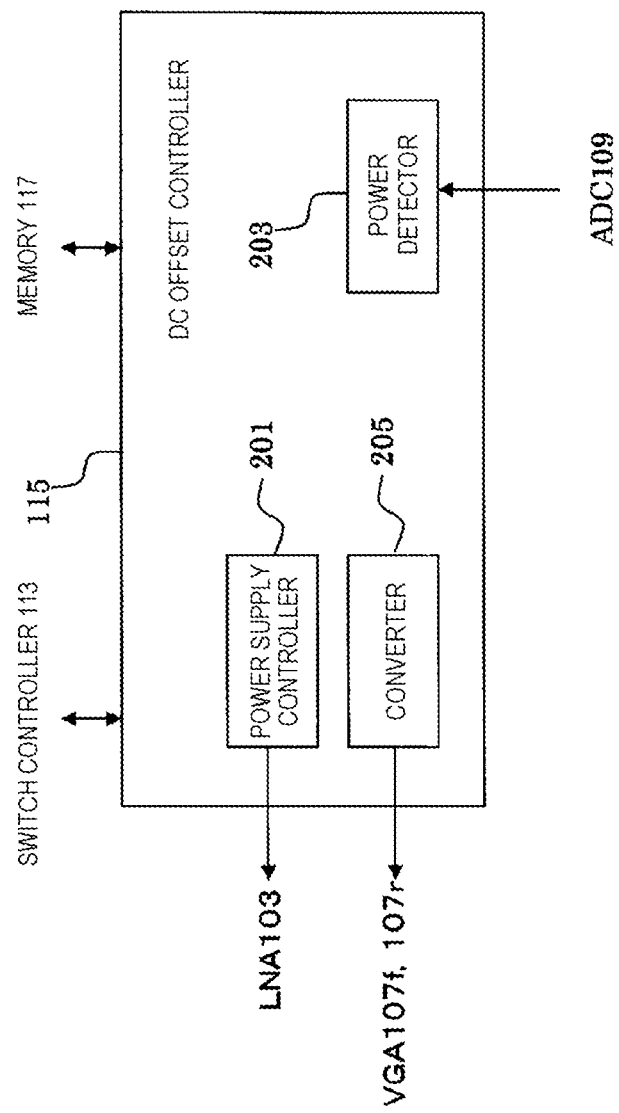
FIG. 3 is a block diagram showing an inner structure of a DC offset controller 115.

FIG. 3 is a block diagram showing an inner structure of the DC offset controller 115. As shown in FIG. 3, the DC offset controller 115 includes a power supply controller 201, a power detector 203 and a converter 205. The power supply controller 201 controls the power supply of the LNA 103. The power detector 203 detects a power level of a reception signal outputted from the ADC 109. The converter 205 converts DC offset correction bits in the table stored in the memory 117 into analog signals and outputs to the VGAs 107$f$ and 107$r$.

Figure 4:
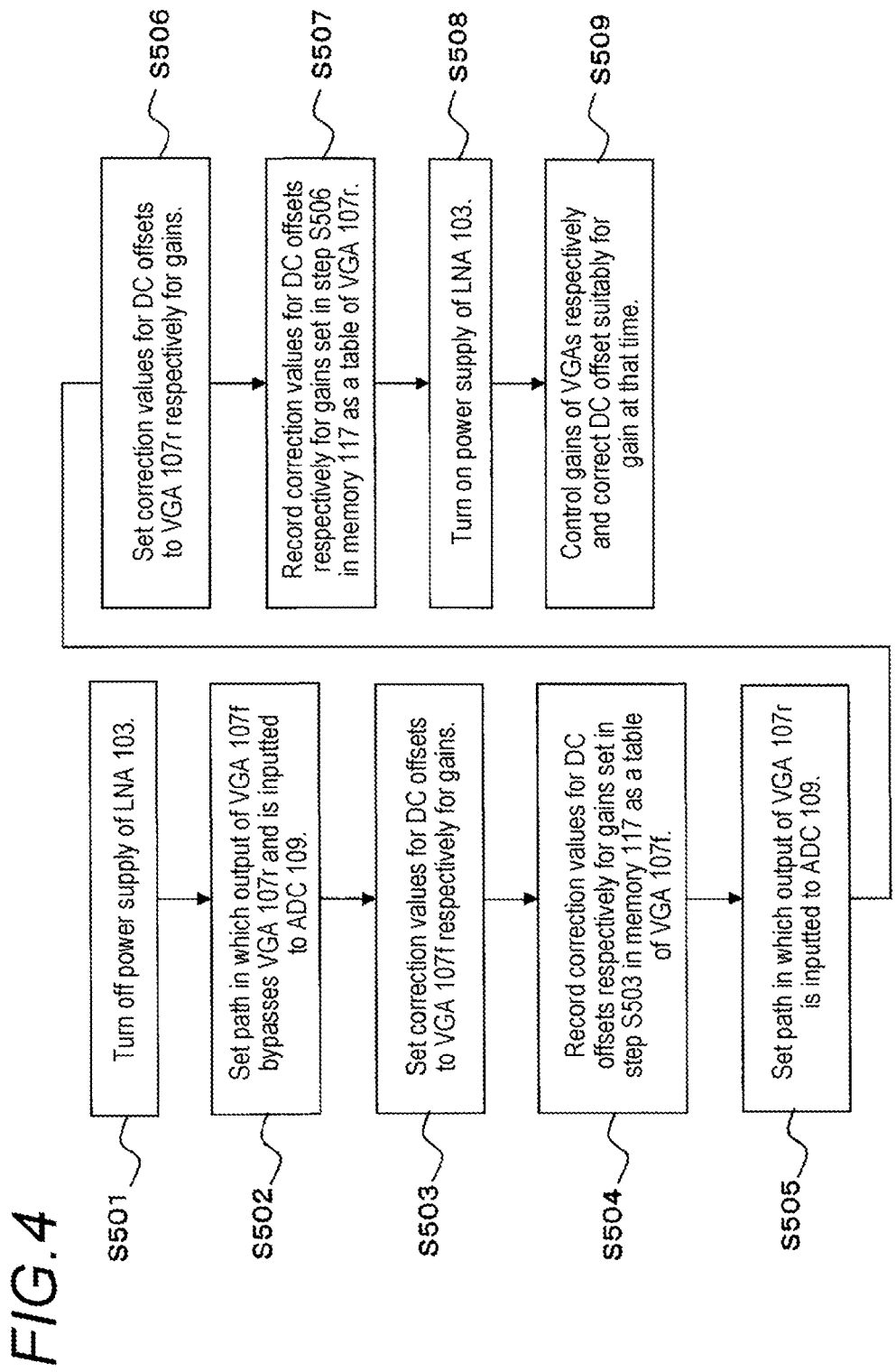
FIG. 4 is a flowchart showing an operation that the reception signal processing device according to the first embodiment corrects the DC offset.

FIG. 4 is a flowchart showing an operation that the reception signal processing device according to the first embodiment corrects the DC offset. Initially, in order to prevent the reception signal and an interference wave from being mixed, the power supply controller 201 of the DC offset controller 115 turns off the power supply of the LNA 103 (step 501).

Further, in the structure that the isolation switch is added between the LNA 103 and the mixer circuit 105, the isolation switch is turned off. In an environment that the reception signal and the interference wave are not mixed, the power supply of the LNA 103 may be kept turned on or the isolation switch may be kept turned on.

Then, the switch controller 113 controls the isolation switches SWf and SWr and the bypass switch section 111 to set the path in which the output of the VGA 107$f$ bypasses the VGA 107$r$ and is inputted to the ADC 109 (step S502). The switch controller 113 sets the isolation switches SWf and SWr to a turning off state and the switches SWb 1 and SWb of the bypass switch section 111 to a turning on state.

Then, the DC offset controller 115 changes the gain of the VGA 107$f$ from a lower limit to an upper limit to set the correction values for the DC offsets to the VGA 107$f$ respectively for the gains by using values converted by the converter 205 so that the DC components of output values of the ADC 109 in the gains are respectively the desired values or smaller (step S503). The correction values for the DC offsets for the gains respectively set by the DC offset controller 115 in the step S503 are recorded in the memory 117 as a table of the VGA 107f (step S504).

Subsequently, the switch controller 113 controls the isolation switches SWf and SWr and the bypass switch section 111 to set the path in which the output of the VGA 107r is inputted to the ADC 109 (step S505). The switch controller 113 sets the isolation switches SWf and SWr to a turning on state and the switches SWb1 and SWb of the bypass switch section 111 to a turning off state.

The DC offset controller 115 changes, as in the step S503, the gain of the VGA 107r from a lower limit to an upper limit of set values to set the correction values for the DC offsets to the VGA 107r respectively for the gains so that the DC components of output values of the ADC 109 in the gains are respectively the desired values or smaller (step S506). The correction values for the DC offsets for the gains respectively set by the DC offset controller 115 in the step S506 are recorded in the memory 117 as a table of the VGA 107r (Step S507).

In the step S506, the DC offset controller 115 corrects the DC offsets in accordance with the table recorded to the VGA 107f in the step S504. Namely, when the DC offset controller 115 sets the correction values for the DC offsets to the VGAs after a second stage, the DC offset controller 115 corrects the DC offsets to the VGA as an object whose gains are to be set respectively for the gains in accordance with the table already set in the VGA of the pre-stage of the VGA as the object whose gains are to be set.

After the DC offset controller 115 sets the correction values for the DC offsets respectively for the gains to all the VGAs and records the tables of the correction values of all the VGAs in the memory 117, the DC offset controller 115 turns on the power supply of the LNA 103 (step S108).

FIG. 4 is the flowchart when there are two stages of the VGAs as shown in FIG. 1. However, even in a structure having three or more stages, operations from S505 to S507 may be added depending on the number of stages.

When the antenna 101 receives the radio signal, the DC offset controller 115 refers to the tables stored in the memory 117, controls the gains of the VGAs respectively and corrects the DC offsets by using the correction values suitable respectively for the set gains to the VGAs (Step S509).

As described above, in the reception signal processing device according to the present embodiment, the correction values for the DC offsets of the VGAs are set respectively for the gains in accordance with the outputs of the ADC 109 provided in the post-stage of the VGA 107r of a final stage. In the present embodiment, the ADC 109 is shared, so that the ADC does not need to be provided for each VGA. As a result, a circuit scale of the reception signal processing device can be reduced and a consumed power of the reception signal processing device can be suppressed. Further, even when the number of the VGAs is increased, an increase of the circuit scale and the consumed power can be suppressed.

Second Embodiment

Figure 5:
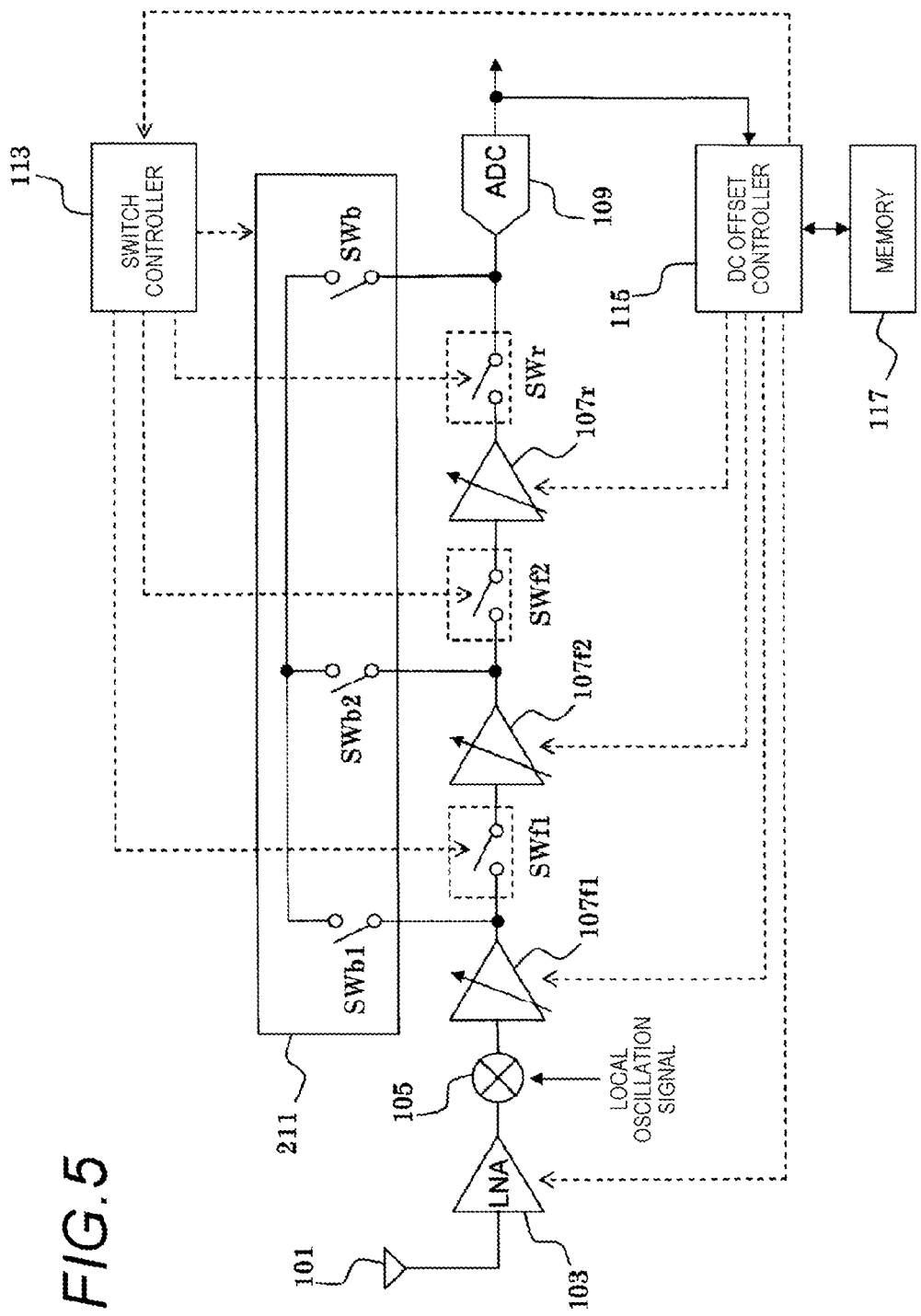
FIG. 5 is a block diagram showing a part of a structure of a reception signal processing device according to a second embodiment.

FIG. 5 is a block diagram showing a part of a structure of a reception signal processing device according to a second embodiment. A difference of the reception signal processing device according to the second embodiment from the reception signal processing device according to the first embodiment resides in the number of VGAs. In the first embodiment, the reception signal processing device includes two VGAs. However, the reception signal processing device according to the second embodiment includes three VGAs. The number of isolation switches and the number of switches provided in a bypass switch section are three like the number of the VGAs. The second embodiment is the same as the first embodiment except the above-described points. In FIG. 5, component elements the same as or equivalent to those of FIG. 1 are designated by the same or equivalent reference numerals to simplify or omit an explanation thereof.

The reception signal processing device shown in FIG. 5 includes three VGAs 107f1, 107f2 and 107r. In post-stages of the VGAs respectively, isolation switches are respectively provided as in the first embodiment. Further, a bypass switch section 211 according to the present embodiment includes switches SWb1, SWb2 and SWb so that an output of the VGA 107f1 of a first stage or an output of the VGA 107f2 of a second stage bypasses the VGA 107f2 and the VGA 107r of the post stages or the VGA 107r and is inputted to an ADC 109.

In the reception signal processing device of the present embodiment, when a DC offset controller 115 sets correction values for DC offsets of the VGA 107f1 respectively for gains, a switch controller 113 sets the isolation switched SWf1, SWf2 and SWr to a turning off state, the switches SWb1 and SWb of the bypass switch section 211 to a turning on state and the switch SWb2 of the bypass switch section 211 to a turning off state. The isolation switch SWf2 may be set to a turning on state.

Further, when the DC offset controller 115 sets correction values for DC offsets of the VGA 107f2 respectively for gains, the switch controller 113 sets the isolation switched SWf1 to a turning on state, the isolation switches SWf2 and SWr to a turning off state, the switches SWb2 and SWb of the bypass switch section 211 to a turning on state and the switch SWb1 of the bypass switch section 211 to a turning off state.

Further, when the DC offset controller 115 sets correction values for DC offsets of the VGA 107r respectively for gains, the switch controller 113 sets the isolation switched SWf1, SWf2 and SWr to a turning on state and the switches SWb1, SWb2 and SWb of the bypass switch section 211 to a turning off state.

Figure 6:
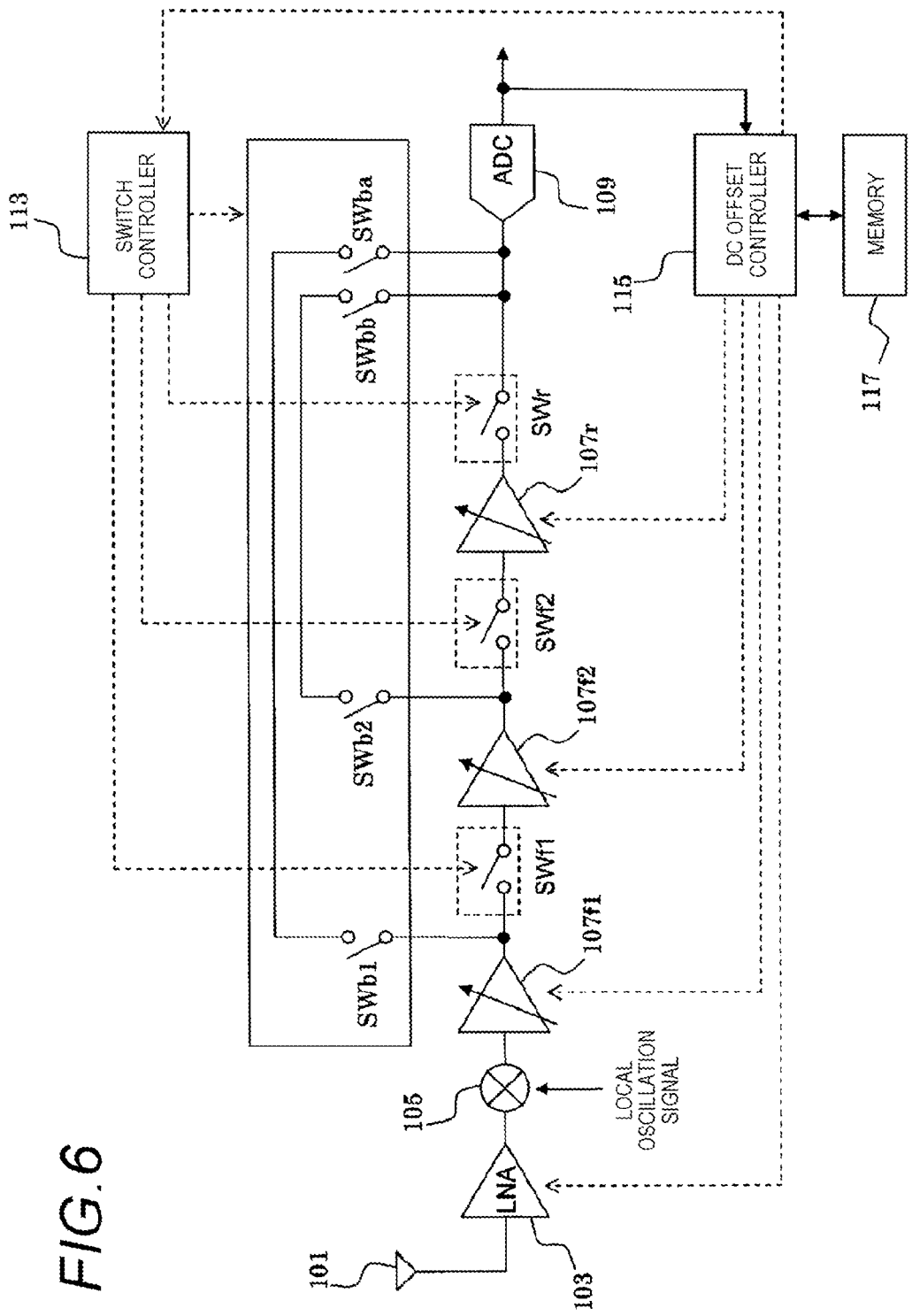
FIG. 6 is a block diagram showing a part of a structure of a reception signal processing device according to another embodiment.

When the reception signal processing device has a structure including the three VGAs 107f1, 107f2 and 107r, as shown in FIG. 6, two switches SWba and SWbb may be provided in place of the switch SWb of the bypass switch section 211 shown in FIG. 5.

Figure 7:
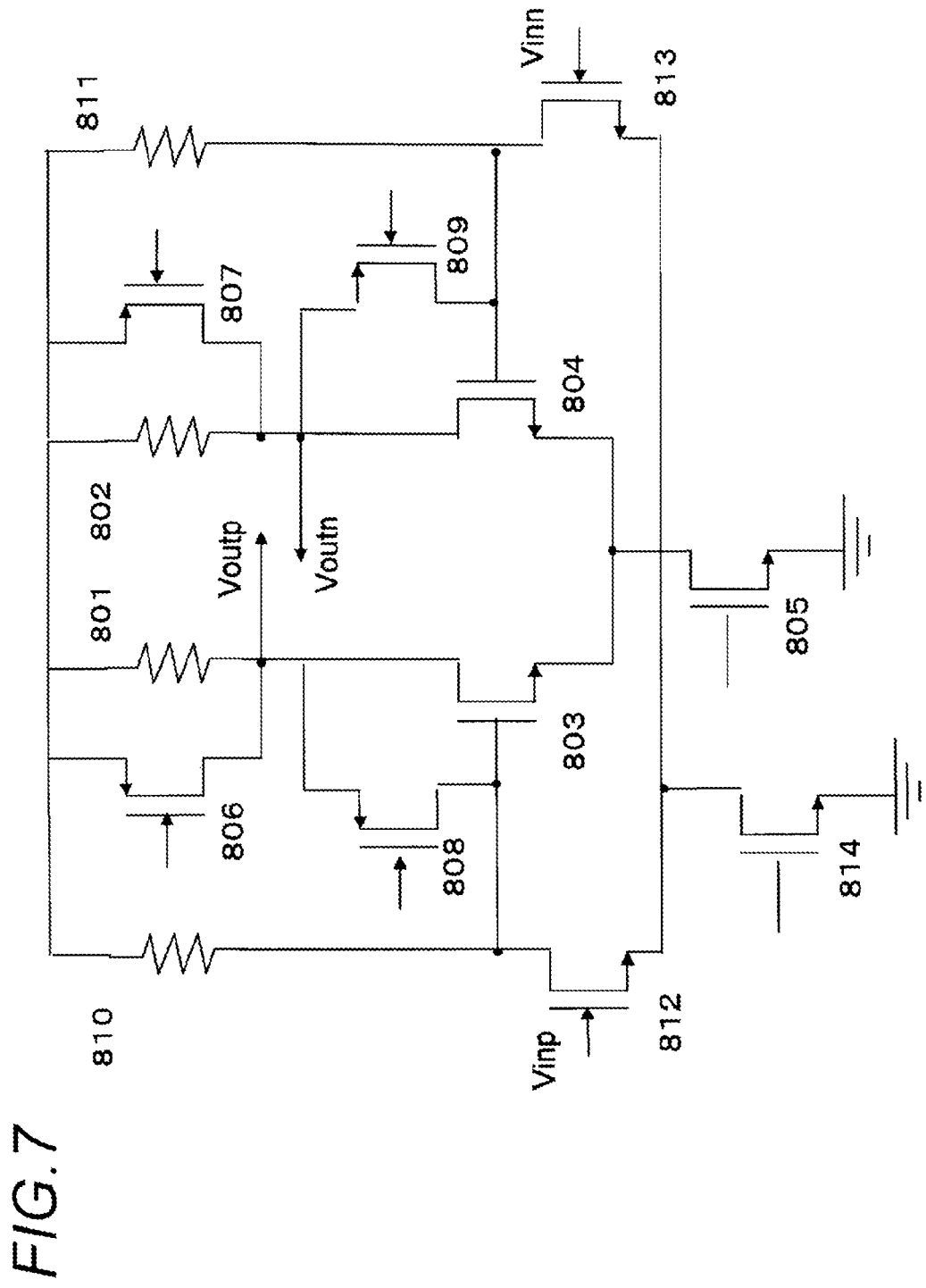
FIG. 7 is a circuit diagram showing one example of a VGA.

FIG. 7 shows one example of the structure of the VGA (107f, 107f1, 107f2, 107r) described in the above-described first embodiment and the second embodiment. The VGA shown in FIG. 7 is a two-stage source ground amplifier including load resistances 801, 802, 810 and 811, input transistors 803, 804, 812 and 813, constant current sources 805 and 814, load controlling transistors 806 and 807 and gain controlling transistors 808 and 809.

As for a control of the gain, when gate voltages of the gain controlling transistors 808 and 809 are commonly controlled, resistance values of the transistors are changed to change feedback amounts. Thus, the gains can be controlled. Gates of the gain controlling transistors 808 and 809 are connected to the DC offset controller 115 to adjust the gains. Gate voltages of the constant current sources 805 and 814 may be changed in place of the gain controlling transistors 808 and 809 to adjust current amounts and adjust the gains.

As for a correction of the DC offset, gate voltages of the load controlling transistors 806 and 807 are individually controlled so that the DC offsets may be corrected.

This is because a differential between drain voltages of the load controlling transistors 806 and 807, that is, an error of a voltage difference of Voutp and Voutn indicates the DC offset.

Accordingly, when the gate voltages are applied so that resistance values of the load controlling transistors 806 and 807 are different from each other in the differential, the DC offset can be corrected.

Figure 8:
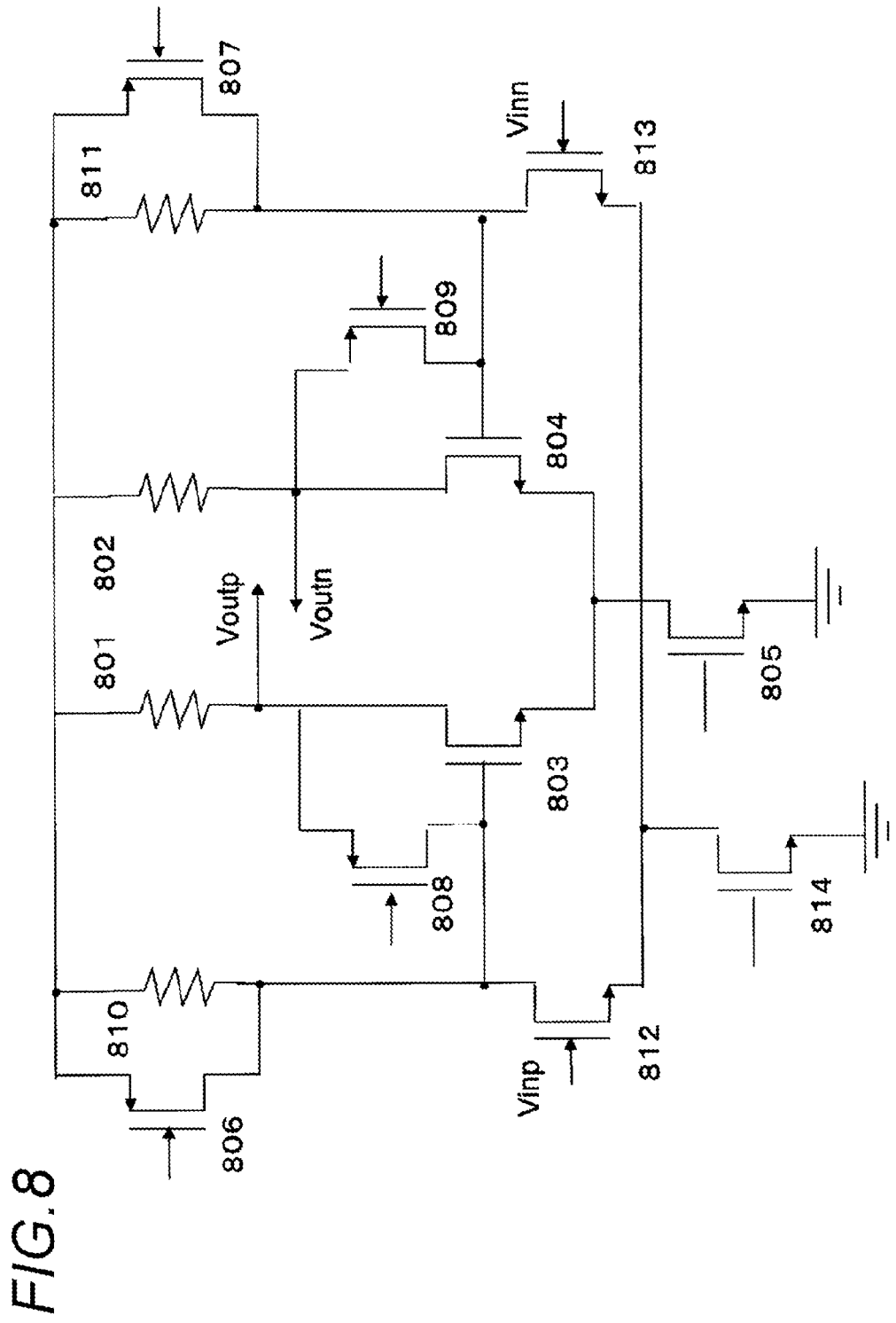
FIG. 8 is a circuit diagram showing another example of the VGA.

As shown in FIG. 8, the load controlling transistors 806 and 807 may be arranged in parallel with the load resistances 810 and 811 in place of the load resistances 801 and 802. The gate voltages of the load controlling transistors 806 and 807 are individually controlled so that the DC offsets may be corrected.

Figure 9:
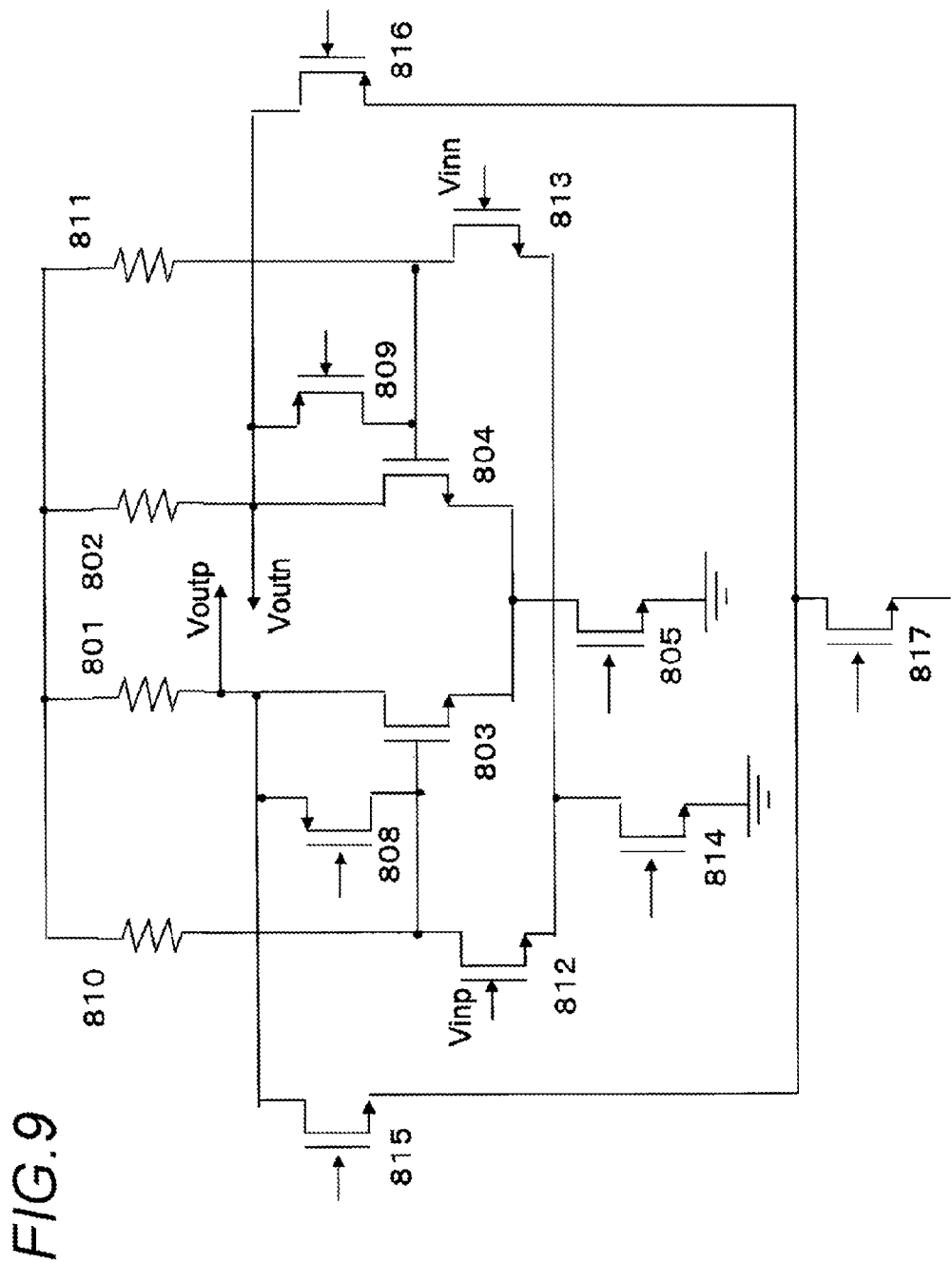
FIG. 9 is a circuit diagram showing a still another example of the VGA.

FIG. 9 shows another example of the structure of the VGA (107f, 107f1, 107f2, 107r) described in the above-described first embodiment and the second embodiment. A VGA shown in FIG. 9 is different from the VGA shown in FIG. 7 in view of a point that the load controlling transistors 806 and 807 are deleted and current controlling transistors 815 and 816 and a constant current source 817 are added. The load controlling transistors 806 and 807 do not need to be deleted. Further, gate voltages of constant current sources 805 and 814 may be changed in place of gain controlling transistors 808 and 809 to adjust current amounts and adjust gains.

Since a control of the gain is the same as that of the VGA shown in FIG. 7, an explanation thereof is omitted. As for a correction of a DC offset, gate voltages of the current controlling transistors 815 and 816 are individually controlled so that the DC offsets may be corrected.

This is because an error of a differential between voltage drops of load resistances 801 and 802 indicates the DC offset. Accordingly, when the gate voltages are applied so that current values of the current controlling transistors 815 and 816 are different from each other in the differential, the DC offset can be corrected.

Figure 10:
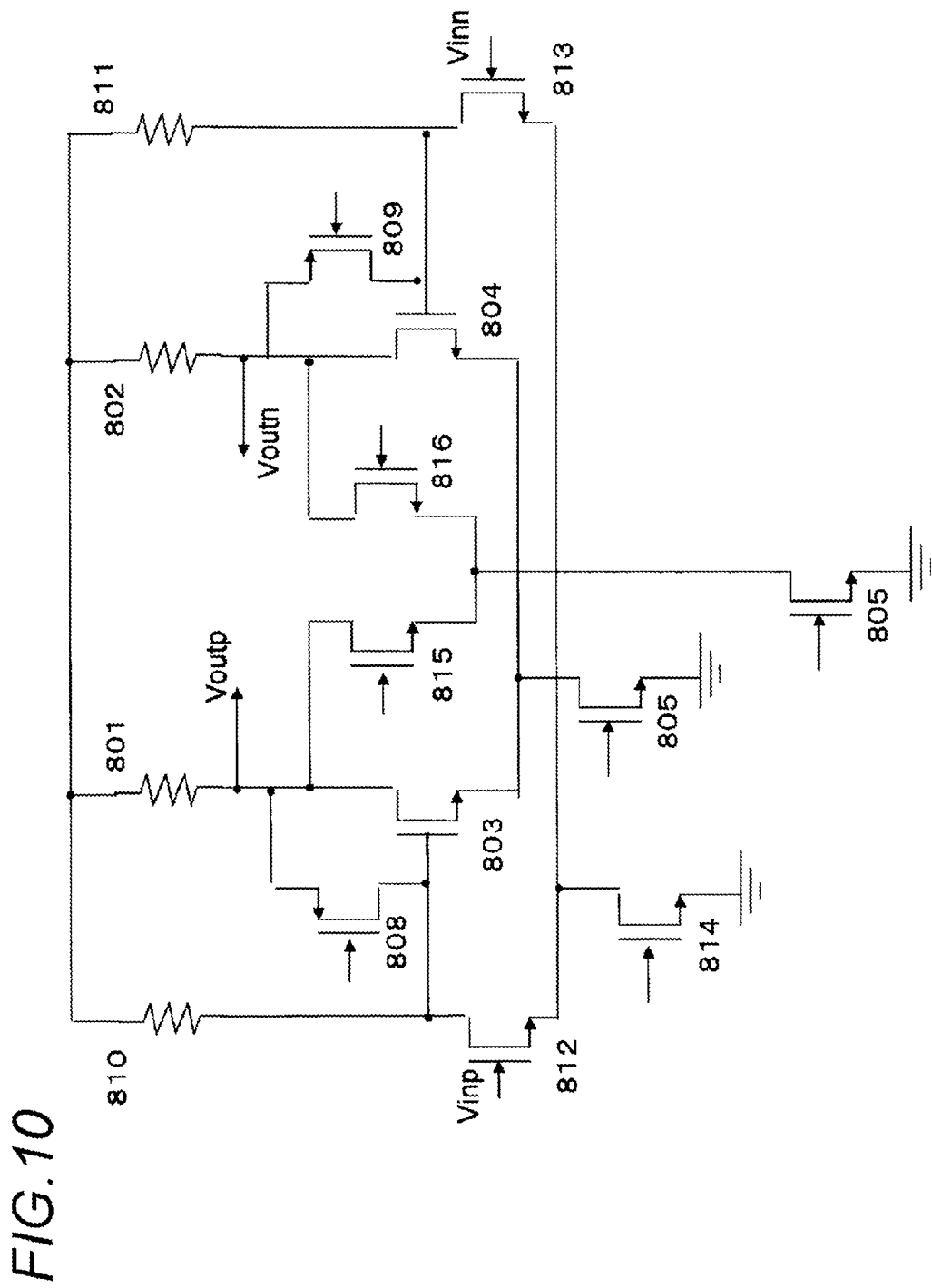
FIG. 10 is a circuit diagram showing other example of the VGA.
Figure 11:
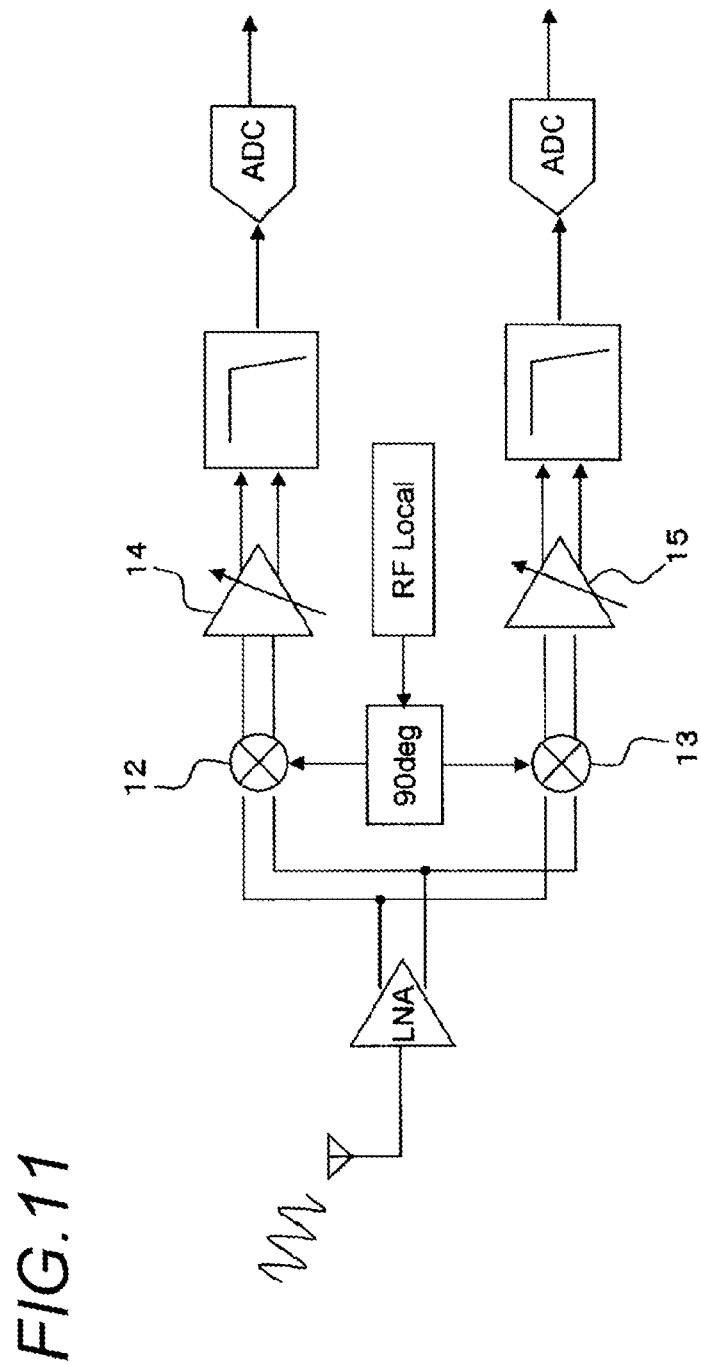
FIG. 11 is a diagram showing a structure of an orthogonal modulation receiving circuit including QPSK using a direct conversion system.
Figure 12:
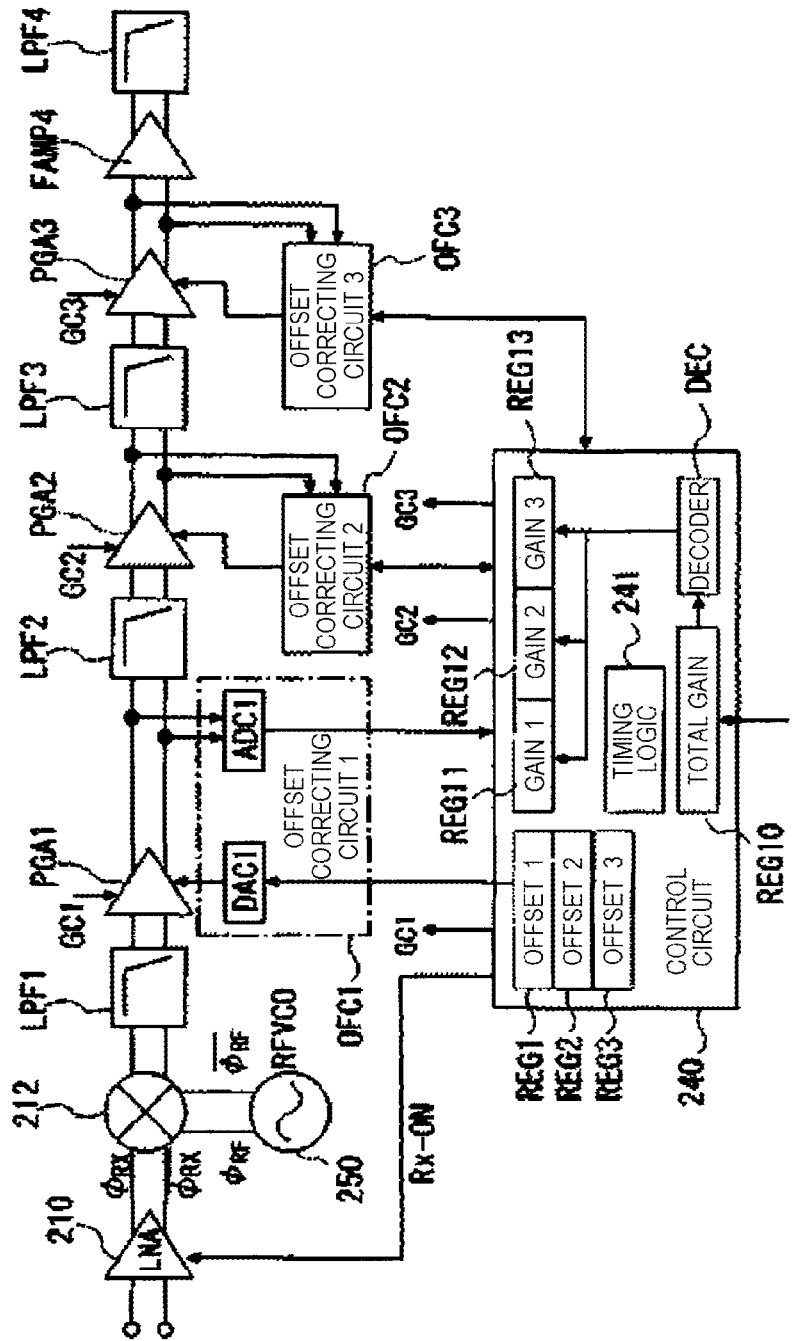
FIG. 12 is a block diagram showing a receiving circuit of the direct conversion system disclosed in Patent Literature 1.

As shown in FIG. 10, current controlling transistors 815 and 816 may be arranged in parallel with input transistors 812 and 813 in place of input transistors 803 and 804. When the current controlling transistors 815 and 816 are individually controlled so that DC offsets may be corrected.

The present invention is described in detail by referring to the specific embodiments. It is to be understood to a person with ordinary skill in the art that various changes or modifications may be made without departing from the spirit and scope of the present invention.

The present application is based on Japanese Patent Application No. 2011-053202 filed on Mar. 10, 2011, the contents of which are incorporated herein by reference.

INDUSTRIAL APPLICABILITY

The reception signal processing device according to the present invention is available as a reception signal processing device which down converts a reception signal of a high frequency to a base-band by using a direct conversion system.

REFERENCE SIGNS LIST

101: antenna
103: LNA
105: mixer circuit
107f, 107f1, 107f2, 107r: VGA
109: AD conversion circuit (ADC)
SWf, SWf1, SWf2, SWr: isolation switch
111, 211: bypass switch section
113: switch controller
115: DC offset controller
117: memory
201: power supply controller
203: power detector
205: converter
SWb1, SWb2, SWb, SWba, SWbb: switch

The invention claimed is:

1. A reception signal processing device which down converts a reception signal of a high frequency to a base-band by using a direct conversion system, the reception signal processing device comprising:
    a mixer section which mixes the reception signal with a local oscillation signal of a predetermined frequency to perform a frequency conversion;
    an amplifying section including a plurality of variable gain amplifiers formed in multi-stages, wherein the plurality of variable gain amplifiers include a first variable gain amplifier and a second variable gain amplifier provided in a post-stage of the first variable gain amplifier;
    a converter which converts an analog signal amplified by the amplifying section to a digital signal;
    isolation switches respectively provided in post-stages of the first variable gain amplifier and the second variable gain amplifier;
    a bypass switch section which sets to open and close a path in which an output of the first variable gain amplifier bypasses the second variable gain amplifier and is inputted to the converter;
    a switch controller which controls the isolation switches and the bypass switch section so that the outputs of the first variable gain amplifier can be inputted to the converter without passing through the second variable gain amplifier; and
    a DC offset controller which sets a correction value for a DC offset in accordance with a gain set in the first variable gain amplifier as an object to be corrected when the reception signal is not inputted to the first variable gain amplifier as the object to be corrected and when an output of the first variable gain amplifier of the object to be corrected is inputted to the converter without passing through the second variable gain amplifier.

2. The reception signal processing device according to claim 1, wherein
    the DC offset controller sets gains from a lower limit to an upper limit for the first variable gain amplifier of the object to be corrected and sets correction values for the DC offsets by which DC components of the output in the respective gains are a predetermined value or smaller.

3. The reception signal processing device according to claim 1, wherein
    the DC offset controller sets correction values for the DC offsets in order from the first variable gain amplifier to the second variable gain amplifier of the amplifying section.

4. The reception signal processing device according to claim 1, wherein
    when the switch controller controls the isolation switches and the bypass switch section to input the reception signal to the first variable gain amplifier as the object to be corrected, the DC offset controller controls gains of the first variable gain amplifier and the second variable gain amplifier to correct the DC offsets of the reception signal in accordance with correction values for the DC offsets which correspond to the controlled gains.

* * * * *